United States Patent [19]

Yamazaki et al.

[11] Patent Number: 4,668,599
[45] Date of Patent: May 26, 1987

[54] PHOTORECEPTOR COMPRISING AMORPHOUS LAYER DOPED WITH ATOMS AND/OR IONS OF A METAL

[75] Inventors: Toshinori Yamazaki, Hachioji; Eiichi Sakai, Niiza; Hiroyuki Nomori, Hachioji, all of Japan

[73] Assignee: Konishiroku Photo Industry Co., Ltd., Tokyo, Japan

[21] Appl. No.: 896,304

[22] Filed: Aug. 12, 1986

Related U.S. Application Data

[63] Continuation of Ser. No. 634,866, Jul. 25, 1984.

[30] Foreign Application Priority Data

Jul. 26, 1983 [JP] Japan ................... 58-137289
Jul. 26, 1983 [JP] Japan ................... 58-137288
Jul. 26, 1983 [JP] Japan ................... 58-137287

[51] Int. Cl.[4] .......................................... G03G 5/082
[52] U.S. Cl. ................................. 430/84; 252/501.1; 357/2; 427/39; 427/74; 430/95; 430/128; 430/136
[58] Field of Search ............. 427/39, 74; 430/128, 430/136, 84, 95; 252/501.1; 357/2

[56] References Cited

U.S. PATENT DOCUMENTS

| | | | |
|---|---|---|---|
| 4,200,473 | 4/1980 | Carlson ........................ | 357/2 X |
| 4,251,289 | 2/1981 | Moustakas et al. ......... | 357/2 X |
| 4,481,149 | 12/1984 | Kawamura et al. ......... | 357/2 X |
| 4,592,985 | 6/1986 | Ogawa et al. ............... | 430/95 |

*Primary Examiner*—John E. Kittle
*Assistant Examiner*—Mukund J. Shaw
*Attorney, Agent, or Firm*—Jordan B. Bierman

[57] ABSTRACT

A process for producing a photoreceptor is disclosed. A gaseous compound of the constituent materials of the photoreceptor is decomposed by glow discharge in the presence of a metal, thereby forming a constituent layer containing atoms and or ions of the metal.

9 Claims, 15 Drawing Figures

PHOTORECEPTOR COMPRISING AMORPHOUS LAYER DOPED WITH ATOMS AND/OR IONS OF A METAL

This application is a continuation of application Ser. No. 834,866, filed July 25, 1984.

This application claims priority of Japanese Application No. 137289/1983, filed July 26, 1983, No. 137288/1983, filed July 26, 1983, and No. 137287/1983, filed July 26, 1983.

BACKGROUND OF THE INVENTION

The present invention relates to a photoreceptor such as one for use in electrophotography, and a process for producing the same.

Conventional photoreceptors for use in electrophotography are made of Se optionally doped with As, Te or Sb, or are made of ZnO or CdS which is dispersed in a binder resin. These photoreceptors are defective in that they contaminate the environment, are not heat stable and have low mechanical strength. Amorphous silicon (a-Si) has recently been proposed as a material for electrophotographic photoreceptors. Amorphous silicon is characterized by the presence of "dangling bonds" formed by the breaking of Si-Si bonds, and because of this defect, amorphous silicon has many localized state levels within the energy gap. The dark resistance of the amorphous silicon is low since thermally excited carriers cause hopping conduction; on the other hand, amorphous silicon has low photoconductivity because photoexcited carriers are trapped at the localized energy levels. In order to avoid these problems, the dangling bonds may be filled up by bonding a hydrogen atom to the defective Si atom.

The amorphous hydrogenated silicon (hereunder a-Si:H) wherein the dangling bonds on Si atoms are filled with hydrogen atoms is most preferred for use in the light-sensitive layer of a photoreceptor since its resistivity changes greatly upon illumination with light in the visible or ultraviolet region.

An electrophotographic copier using an a-Si photoreceptor made of a-Si:H is depicted in FIG. 1. This copier comprises a cabinet 1 which has on its top a glass table 3 on which the original 2 is to be set. The original 2 is to be covered with a platen cover 4. Below the original table 3 is provided a horizontally moving optical scanner composed of a light source 5 and a first mirror unit 7 having a first reflective mirror 6. In order to scan the original in such a manner that the length of the optical path between the scanning point on the original and the photoreceptor around a drum 9 is held constant, a second mirror unit 20 moves at a speed equal to the travelling speed of the first mirror unit 7, and the light reflected from the table 3 passes through a lens 21 and a reflective mirror 8 to fall in a slit form on the photoreceptor drum 9. Being an image support, the drum 9 is surrounded by a corona charger 10, a developing unit 11, a transfer unit 12, a separator unit 13 and a cleaner unit 14. Paper feeder 15 delivers copy paper 18 through rollers 16 and 17, and after a toner image is transferred from the drum 9 onto this copy paper, the image is fixed in a fixing unit 19 and the paper is discharged into a tray 35. The fixing unit 19 comprises a heating roller 23 having a built-in heater 22, and a pressure roller 24; the developed image on the paper is fixed permanently by passing the paper is fixed permanently by passing the paper between the rollers 23 and 24.

The photoreceptor having an a-Si substance on the surface is sensitive to the atmosphere and moisture. The surface of the photoreceptor is also low in stability against chemical species formed as a result of corona discharge that occurs in sections 10, 12 and 13 of FIG. 1 during the electrophotographic process. Because of these phenomena, the photoreceptor having an a-Si substance on the surface has the following defects.

(1) The bulk of the a-Si layer has a fairly good structure of Si-Si bonds, but the surface of the layer has many energy levels due to defective Si-Si bonds such as discontinuous or dangling bonds. Furthermore, a-Si has a rigid structure and any defective bond that has occurred during film making will be permanently fixed in the film structure. Therefore, when the a-Si photoreceptor is used within the apparatus of FIG. 1, ions, molecules or atoms present in an atmosphere produced by corona discharge or in any other atmosphere are easily adsorbed on the surface of the photoreceptor, and this reduces the electrical resistance of the photoreceptor on its surface, thereby increasing the chance of surface leakage of charges.

(2) In addition to the instability of electrical and photoconductive characteristics, the a-Si photoreceptor produces an indistinct image or white specks. In the first few cycles of copying operation, the photoreceptor has a surface potential profile after exposure as illustrated in FIG. 2(A). After a number of copying cycles, the surface potential has a profile as shown in FIG. 2(B) wherein the potential in the unexposed area is not sharply distinguished from the potential in the exposed area, and the potential in the unexposed area itself is lower than the value for the freshly used photoreceptor surface (the potential of which is depicted in FIG. 2(B) by the dashed line). This deteriorative change is most probably due to the surface leakage of charges discussed in (1) above.

(3) After its manufacture, the a-Si photoreceptor causes elimination of hydrogen atoms due to exposure to light or heat, and this is another source of the defects shown above.

(4) Because of the reasons mentioned above, the a-Si photoreceptor does not have sufficient long-term stability and this is another problem that requires early solution before the photoreceptor can be put to commercial use.

As a result of various studies to solve these problems, the present inventor has obtained the following observation. Before corona discharge, no ion, molecule or atom is adsorbed on the surface of the photoreceptor, which therefore, has the energy band structure shown in FIG. 3. After corona discharge, activated (or stable) ions are formed and adsorbed on the photoreceptor's surface, and at the same time, ambient ions are also adsorbed on the photoreceptor. This adsorption introduces impurity levels near the surface of the photoreceptor, causing a shift in the Fermi level ($E_F$) in that area. Since the Fermi level near the surface of the photoreceptor must coincide with the Fermi level in the volume, the energy band for the surface area bends as shown in FIG. 4, and this band bending causes carriers to accumulate to form a space charge layer. The band bending occurs fairly deep into the photoreceptor and its depth (d) is sometimes up to 1 $\mu$m below the surface of the photoreceptor. As a result of this accumulation of carriers due to band bending caused by adsorption of gases on the photoreceptor, the electrical conductivity of its surface may be appreciably increased to cause an indistinct image. FIG. 5 shows the electron state density profile of the photoreceptor on which gases have been adsorbed; in FIG. 5, $E_D$ is the donor level produced by the gas adsorption; $E_c$ shows the energy level of the bottom of the conduction band; $E_v$ shows the energy level of the top of the valence band.

An a-Si photoreceptor having an electron acceptor or donor substance adsorbed to its surface has been developed with a view to stabilizing the surface and controlling its electrical properties. However, being simply adsorbed onto the surface, the electron acceptor or donor substance is easily detached during cyclic use of the photoreceptor, and this substantially limits its service life. This problem becomes all the more significant because the electron acceptor or donor substance adsorbed on the photoreceptor is made of an organic compound which differs greatly in properties than the inorganic a-Si of which the bulk of the photoreceptor is made.

SUMMARY OF THE INVENTION

Therefore, one object of the present invention is to provide an a-Si photoreceptor that meets various requirements such as stabilized electrical properties on the surface, prevention of surface leakage of charges, prevention of an indistinct image and white specks, improved resolution, tone gradation and image density, improved image stability against cyclic use, and long-term stability.

Another object of the present invention is to provide a process for producing a photoreceptor satisfying all of the requirements mentioned above.

The first object of the present invention is achieved by an a-Si photoreceptor wherein at least one of the constituent layers has metallic atoms and/or metallic ions incorporated therein.

The second object of the present invention is achieved by a process wherein a gaseous compound of a certain constituent, especially silicon, is decomposed by glow discharge in the presence of a specified metal, thereby forming a constituent layer, particularly an a-Si layer, containing metallic atoms and/or metallic ions therein.

BRIEF DESCRIPTION OF THE DRAWINGS

FIGS. 1 to 5 show the prior art, wherein:

FIG. 1 is a schematic section of the conventional electrophotographic copier;

FIGS. 2(A) and 2(B) are graphs showing the change in the surface potential profile of an exposed a-Si photoreceptor;

FIG. 3 is an energy band diagram for an a-Si photoreceptor before gases are adsorbed on its surface;

FIG. 4 is an energy band diagram for the same photoreceptor having gases adsorbed thereon; and FIG. 5 is a diagram showing the electron state density profile of the photoreceptor depicted in FIG. 4.

FIGS. 6 to 12 show embodiments of the present invention, in which:

FIG. 6 is an energy band diagram for a typical example of the a-Si photoreceptor of the present invention;

FIGS. 7 to 10 are cross sections of various embodiments of the a-Si photoreceptor according to the present invention;

FIG. 11 is a schematic section of the glow discharge unit that can be used to prepare the photoreceptor of the present invention;

FIG. 12 is a schematic section of the source of a gaseous Fe compound that is to be supplied into the discharge unit of FIG. 11;

DETAILED DESCRIPTION OF THE INVENTION

Figure 1:
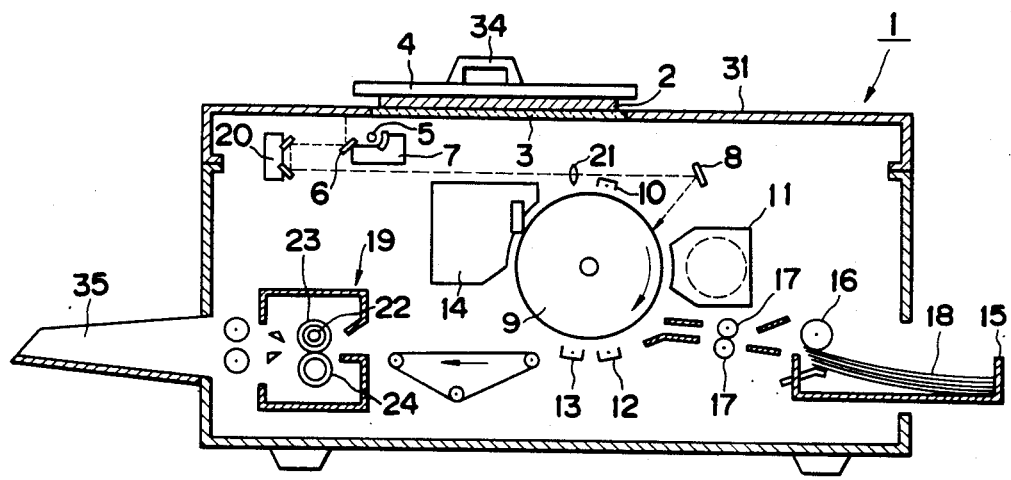
Figure 2:
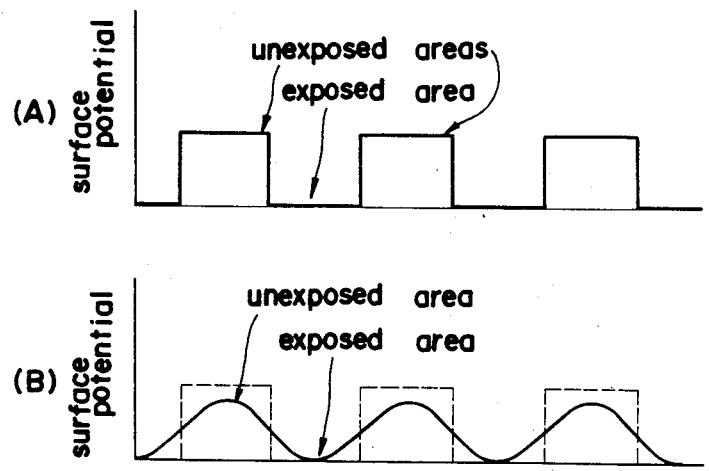
Figure 3:
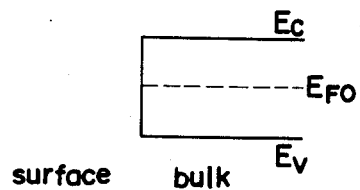
Figure 4:
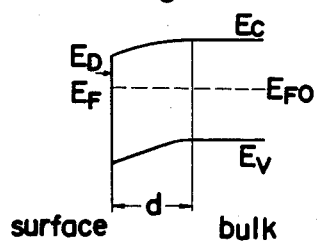
Figure 5:
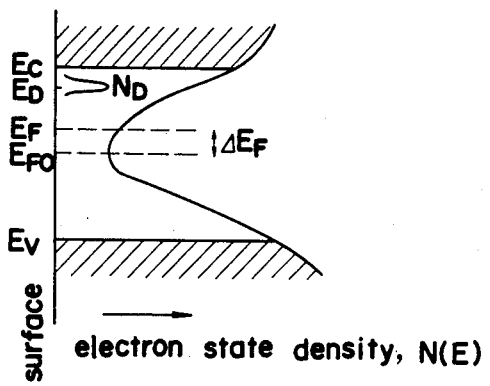
Figure 6:
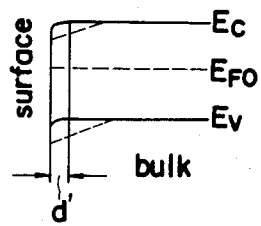

According to the present invention, the layer that is formed by glow discharge decomposition and which contains metallic atoms and/or metallic ions has a fairly significant number of impurity or trapping levels formed in the vicinity of the surface of the layer owing to the introduction of said metallic atoms and/or ions. Any ions, atoms or molecules that are adsorbed to the surface of the photoreceptor are most likely to be trapped and fixed by such metallic atoms or ions. The impurity levels formed by these metallic atoms or ions cause band bending near the surface of the photoreceptor, but as shown in FIG. 6, the depth (d') of the resultant band bending is very small (d' $<<$ 1 $\mu$m), unlike the band bending depicted in FIG. 4 whose depth (d) is almost equal to 1 $\mu$m and indicated in FIG. 6 by the dashed line. Because the location of the band bending is very shallow, the accumulation of charges or formation of a space charge layer, if any, in the photoreceptor of the present invention is not significant, and this reduces the change in the electrical conductivity of the surface of the photoreceptor, thereby effectively preventing the formation of an indistinct image or white specks.

In order to achieve these advantages, the metal to be incorporated in the a-Si surface protective layer should preferably have incomplete d sub-shells (i.e., not all of the electron seats in the d orbit family are occupied) because this type of metal is highly effective in trapping ions, molecules or atoms adsorbed on the photoreceptor. Illustrative metals that meet this requirement are transition metals of groups 1b, 2b, 3b, 4b, 5b, 6b, 7b, and 8 of the periodic table. Specific examples are Fe, Al and Ni, and Fe is particularly preferred. The periodic table here referred to is the one shown in "Handbook of Chemistry and Physics", 58th ed., 1977–1978. Preferred metallic atoms are those which constitute Friedel-Crafts catalysts such as $AlCl_3$, $SbCl_5$, $FeCl_2$, $FeCl_3$, $SnCl_4$, $TiCl_4$, $TeCl_4$, $BiCl_3$, $ZnCl_2$ and $BF_3$.

It should be noted that according to the method of the present invention, the layer containing metallic atoms and or ions is formed by glow-discharge decomposition in the presence of a metal. By this technique, the target (metal containing material) whose size is of the molecular order can be deposited to provide a film having a fine and precisely controlled structure. Furthermore, the quality of the film can be easily controlled by properly selecting the glow discharge conditions. Therefore, according to the present invention, a film having the desired properties for use as a constituent layer in the a-Si photoreceptor can be consistently produced.

The metal to be incorporated in the photoreceptor of the present invention may be supplied in various forms such as a gas made of a metallic atom or a metallic compound, or a liquid, particularly in the form of an atomized liquid, or a solid, particularly in the form of fine solid particles.

Figure 7:
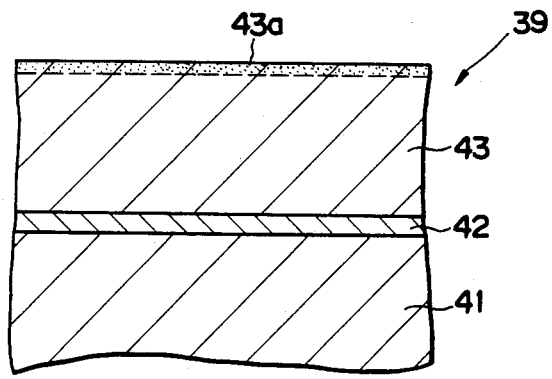

Various embodiments of the present invention are hereunder described in detail. While the methods for producing the a-Si electrophotographic photoreceptor according to the present invention will be described later in this specification, various embodiments of the photoreceptor per se are first discussed by reference to FIGS. 7 to 10. A photoreceptor generally indicated at 39 in FIG. 7 is composed of an electrically conductive support 41 which is typically made of aluminum, a p-type charge blocking layer 42 made of a-Si:H which is heavily doped with an element of group 3a (e.g. boron) of the periodic table, and an i-type photoconductive layer 43 made of a-Si:H which is lightly doped with an element of group 3a (e.g. boron) of the periodic table. As shown in FIG. 7, the Al support 41 is overlaid with the charge blocking layer 42, which is further coated with the photoconductive layer 43. The photoconductive layer 43 has a sufficient ratio of the dark resistivity $\rho_D$ to resistivity $\rho_L$ when light is on, and hence has a satisfactory sensitivity to light, especially to the one in the visible and ultraviolet ranges. By doping with an element of group 3a, such as boron, of the periodic table in a flow ratio of 1–500 ppm, ($B_2H_6/SiH_4$), the photoconductive layer 43 may be rendered intrinsic to have an intrinsic resistance of as high as $10^{11}$–$10^{12}$ ohms.cm.

It is important for the purposes of the present invention that the outermost part or its nearby area 43a in the bulk (as defined by the dashed line) of the photoconductive layer 43 have a predetermined amount of atoms and/or ions of a metal, especially Fe. As already mentioned, the atoms or ions of this metal reduce the adverse effects of adsorbate on the surface of the photoreceptor, thereby minimizing the change in the electrical conductivity of the photoreceptor's surface so that it can be provided with improved characteristics such as the absence of an indistinct image.

In order to meet these requirements, the metal is preferably incorporated in the layer 43a in an amount of 1–10,000 ppm with respect to the silicon atom. If the content of the metal is less than 1 ppm, the intended advantage of incorporating the metal is not obtained. If the content of the metal exceeds 10,000 ppm, the depth of band bending increases or other adverse effects on the photosensitive characteristics of the photoreceptor will result. A more preferred range of the metal content is from 5 to 500 ppm. The metal containing layer 43a preferably has a thickness of 50 Å–20,000 Å, more preferably from 50 to 5,000 Å, with the range of 400 to 2,000 Å being most preferred.

By increasing the resistivity of the photoconductive layer 43 through boron doping, the ability of that layer to retain charges can be improved. By so doing, the layer can be provided with not only high light sensitivity but also improved charge retaining ability. In order to prevent sufficiently the injection of electrons from the support 41, the charge blocking layer 42 is preferably rendered p-type (or even p+-type) by doping with an element of group 3a (e.g. boron) of the periodic table in a flow ratio of 500–100,000 ppm ($B_2H_6/SiH_4$). The photoconductive layer 42 typically has a thickness of 2–80 μm, preferably 5–30 μm, whereas the thickness of the blocking layer 42 is typically from 100 Å to 10,000 Å, preferably from 400–5,000 Å. If the thickness of the photoconductive layer 43 is less than 2 μm, it is unable to have a sufficient charge potential. A photoconductive layer thicker than 80 μm is not only impractical but also undesired from a process viewpoint because it takes much time to fabricate.

If the thickness of the blocking layer 42 is less than 100 Å, no blocking effect is achieved. If its thickness is greater than 1 μm ($10^4$ Å), it does not have sufficient charge transporting ability. It is necessary that both photoconductive layer 43 and blocking layer 42 contain hydrogen. Hydrogen in the photoconductive layer 43 is indispensable not only for correcting dangling bonds on Si atoms but also for improving the photoconductivity and charge retention of that layer. Usually, the layer 43 contains 1–40 atom % of hydrogen, and the presence of 10–30 atom % of hydrogen is more preferred. In addition to boron, other elements of group 3a of the periodic table such as Al, Ga, In and Tl may be incorporated in the blocking layer 42 in order to change its conduction type to p-type. This layer may be rendered n-type and dopants suitable for this purpose are elements of group 5a of the periodic table, such as P, As, Sb and Bi.

Figure 8:
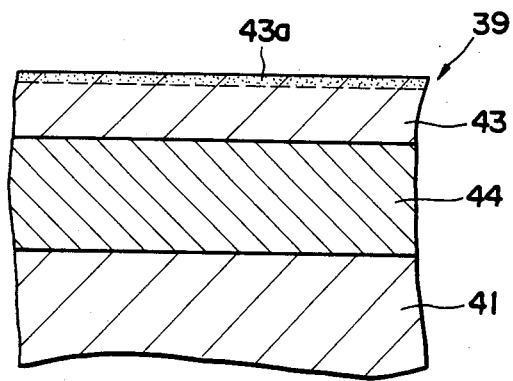

A photoreceptor generally indicated also at 39 in FIG. 8 consists of an electrically conductive support 41 which is overlaid successively with an a-SiC:H layer 44 and a-Si:H (photoconductive) layer 43. The primary functions of the layer 44 are potential retention, charge transport, and providing improved adhesion to the support 41. The layer 44 typically has a thickness of 2–80 μm, preferably 5–30 μm. The photoconductive layer 43 generates charge carriers upon illumination with light, and its thickness generally ranges from 3,000 to 50,000 Å, preferably from 5,000 to 30,000 Å. In order to ensure smooth carrier mobility, the photoconductive layer 43 is preferably undoped with an impurity such as boron.

As in the case of the photoreceptor of FIG. 7, the surface region 43a of the photoconductive layer 43 contains a metal in order to achieve the same advantages as already mentioned above.

Figure 9:
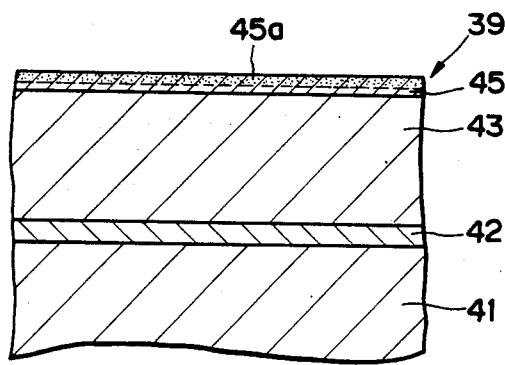

FIG. 9 shows a modification of the photoreceptor of FIG. 7; the photoconductive layer 43 is further overlaid with a surface protective layer 45 made of hydrogenated amorphous silicon nitride (a-SiN:H), the most outer surface of which forms a layer 45a containing the metal specified above.

The surface protective layer 45 works as a surface modifying layer and is effective in providing the surface of the a-Si photoreceptor with improved features, such as better surface potential characteristics, long-term stability of these characteristics, extended stability against environmental changes (improved resistance to moisture, ambient atmosphere or chemical species produced by corona discharge), longer cyclic life due to high surface hardness, improved heat resistance during use, and better heat transferability, particularly good contact fusion transferability.

Since this surface protective layer 45 contains the above specified metal in layer 45a, the additional advantages already mentioned can also be exhibited.

Figure 10:
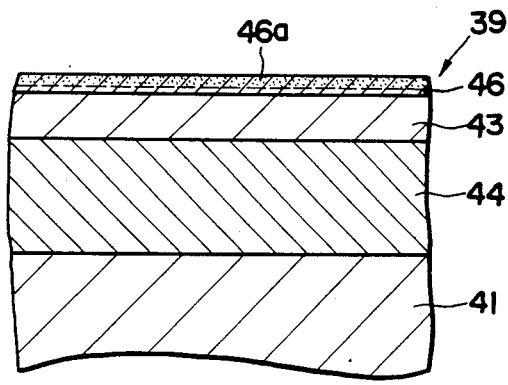

FIG. 10 shows a modification of the photoreceptor of FIG. 8; the photoconductive layer 43 is overlaid with a second a-SiC:H layer 46 (the first a-SiC:H layer is indicated at 44) which, like the a-SiN:H layer 45, works as a surface modifying layer. Again, the outermost region 46a of the layer 46 contains the above specified metal and is not only capable of modifying the surface characteristics of the photoreceptor but also effective in avoiding any deleterious effects of adsorbate gases.

Each of the layers 43a, 45a and 46a shown in FIGS. 7 to 10 preferably contains a transition metal having incomplete d sub-shells, and Fe is particularly preferred. Aluminum and nickel are also usable. The layers 45a and 46a are preferably formed to a depth of at least 50 Å, and the surface protective layers 45 and 46 may be entirely made of these layers.

The surface modifying layer 45 shown in the embodiment of FIG. 9 may be made of a-SiC:H, whereas the surface modifying layer 46 shown in the embodiment of FIG. 10 may be made of a-SiN:H. Each of these surface modifying layers may be made of other substances such as a-SiO:H, a-SiO:H:F, and a-SiO:F. In the embodiment of FIG. 10, the charge transport layer 44 may be lightly doped with boron or other suitable elements, or it may be spaced from the support 41 by a blocking layer 42 (as shown in FIG. 9) which is made of an a-SiC:H layer and heavily doped with boron.

Figure 12:
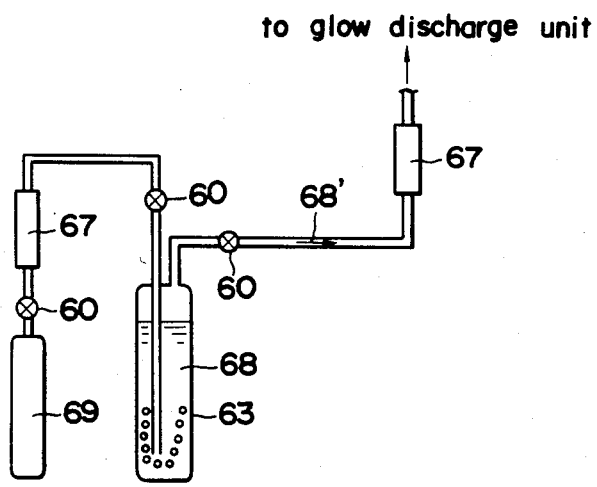

One process for producing the photoreceptors described above (such as of a drum shape), and the glow discharge unit for use with this method are hereunder explained by reference to FIGS. 11 and 12.

Figure 11:
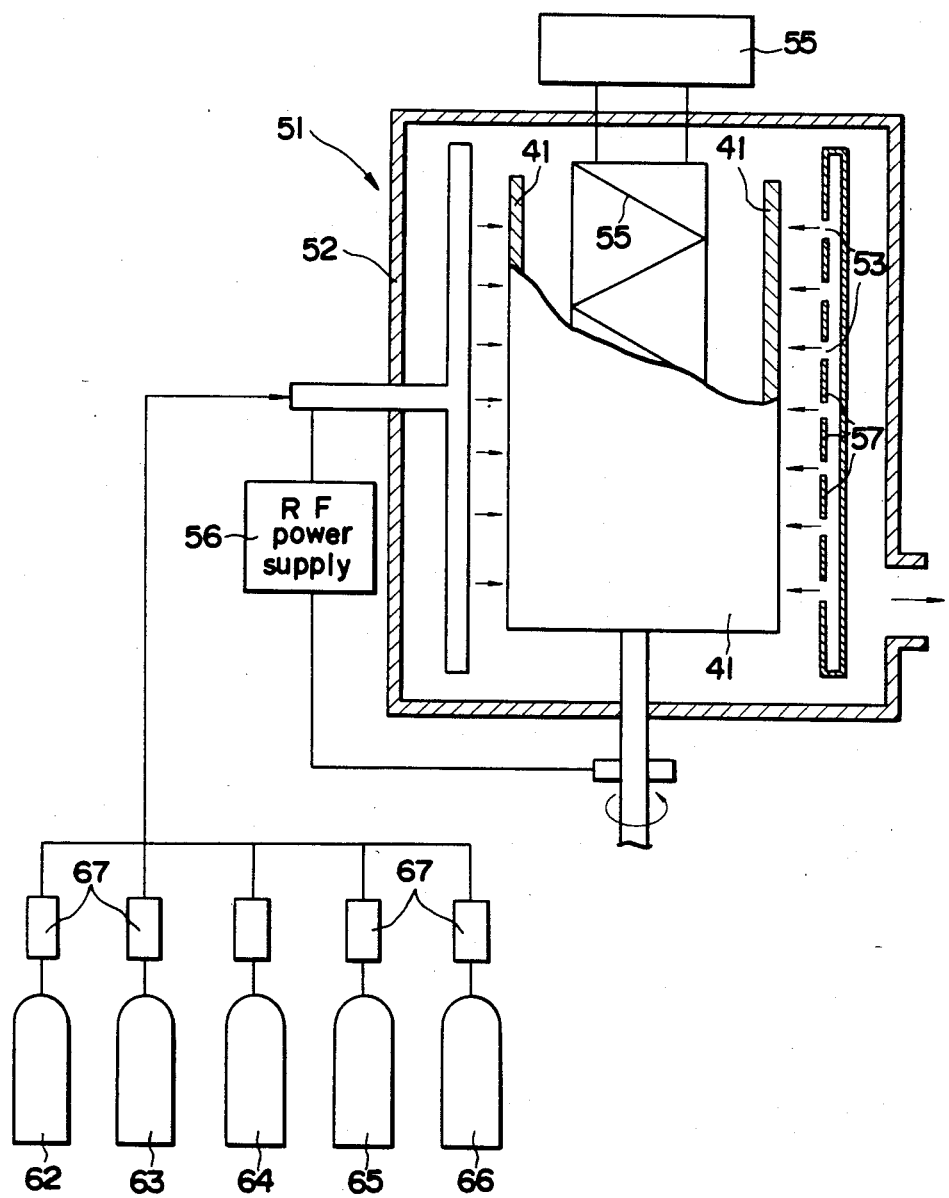

An apparatus generally indicated at 51 in FIG. 11 comprises a vacuum chamber 52 and a vertical, rotatable substrate drum 41 which is contained in it and which can be internally heated to a predetermined temperature by a heater 55. The substrate 41 is surrounded by a cylindrical radio-frequency electrode 57 with perforations 53 which is to cause glow discharge with the substrate 41 by a r-f power supply 56. In FIG. 11, the numeral 62 indicates a supply source of $SiH_4$ or gaseous silicon compound; 63 is a supply source of a gaseous Fe compound; 64 is a supply source of a hydrocarbon gas (e.g. $CH_4$) or a gaseous nitrogen compound (e.g. $NH_3$ or $N_2$); 65 is a supply source of a carrier gas (e.g. Ar); 66 is a supply source of an impurity gas (e.g. $B_2H_4$ or $PH_3$); and 67 is a flowmeter.

The operation of the apparatus 51 proceeds as follows. After setting a clean-surfaced Al substrate 41 in the vacuum chamber 52, the chamber 52 is evacuated to a pressure of $10^{-6}$ Torr while heating the substrate 41 at a predetermined temperature, typically 100°–350° C., preferably 150°–300° C. Then, a mixture of $SiH_4$ or a gaseous silicon compound and a gaseous Fe compound, as well as $CH_4$ (or $NH_3$ or $N_2$) and $B_2H_6$ are supplied into the chamber 52 while a high-purity inert gas is fed as a carrier. At the same time, the rf power source 56 is turned on to apply a high-frequency (e.g. 13.56 MHz) voltage is applied to the electrode 57 at a pressure of 0.01–10 Torr. This causes the reactive gases to be decomposed by glow discharge occurring between the electrode 57 and substrate 41, and as a result, a-Si:H (or a SiC:H), a-Si:H and Fe-containing a-Si:H (or a-SiN:H or a-SiC:H) are continuously deposited on the substrate as respective layers 42 (or 44), 43 and 43a (or 45 and 45a or 46 and 46a) to form photoreceptors according to the embodiments of FIGS. 7 to 10.

In order to provide the Fe-containing layer 43a, 45a or 46a in the method shown above, a gaseous Fe compound is supplied from its source 63. A typical configuration of this Fe compound source is shown in FIG. 12; a container 63 filled with a liquid pool of iron pentacarbonyl $[Fe(CO)_5]$ is bubbled with a controlled flow of Ar gas 69; the resulting gas mixture 68' [$Fe(CO)_5$ plus carrier Ar gas] is introduced into the glow discharge unit 51 through a flowmeter 67. The $Fe(CO)_5$ in the container 63 typically has a vapor pressure of 34 Torr and a temperature of 25° C. in the liquid state. In FIG. 12, the numeral 60 indicates a flow regulating valve. The $Fe(CO)_5$ gas introduced into the unit 51 is decomposed by glow discharge together with the other reactive gases also introduced into the unit, and the resulting Fe atoms or ions are incorporated in the a-Si:H layer being deposited on the substrate 41, thereby forming the Fe-containing layer 43a (45a or 56a). Therefore, the Fe-containing layer 43a (45a or 46a) can be provided easily and accurately by introducing $Fe(CO)_5$ gas as described above after a predetermined thickness of the a-Si:H (or a-SiN:H or a-SiC:H) layer has been deposited on the substrate 41 in the absence of $Fe(CO)_5$.

In the method described above, the substrate 41 is held at 100°–350° C. while any one of a-Si layers is formed thereon. This is effective for producing a photoreceptor with improved quality (especially its electrical characteristics).

In order to correct dangling bonds on Si atoms during the formation of the a-Si layer, fluorine either alone or in combination with hydrogen may be introduced in the form of $SiF_4$ so as to provide a-Si:F, a-Si:H:F, a-SiN:F, a-SiN:H:F, a-Si:C:F or a-SiC:H:F. The preferred amount of fluorine used in this case ranges from 0.01 to 20 atom %, with the range of 0.5–10 atom % being particularly preferred.

In the method of glow-discharge decomposition shown above, Fe is supplied in the form of $Fe(CO)_5$ gas, but it should be understood that Fe may be supplied into the glow discharge unit in other forms such as a fine particulate Fe compound (e.g. ferrocene) or an atomized Fe compound (e.g. iron pentacarbonyl).

The a-Si photoreceptor of the present invention may also be fabricated by sputtering, ion plating or by evaporating Si in the presence of activated or ionized hydrogen which is being introduced through a hydrogen discharge tube. The last-mentioned technique is shown in Japanese Patent Application Ser. No. 152455/79 which was filed by the same applicant as that of subject application and which was later published as Japanese Patent Laid-Open No. 78413/81.

Figure 13:
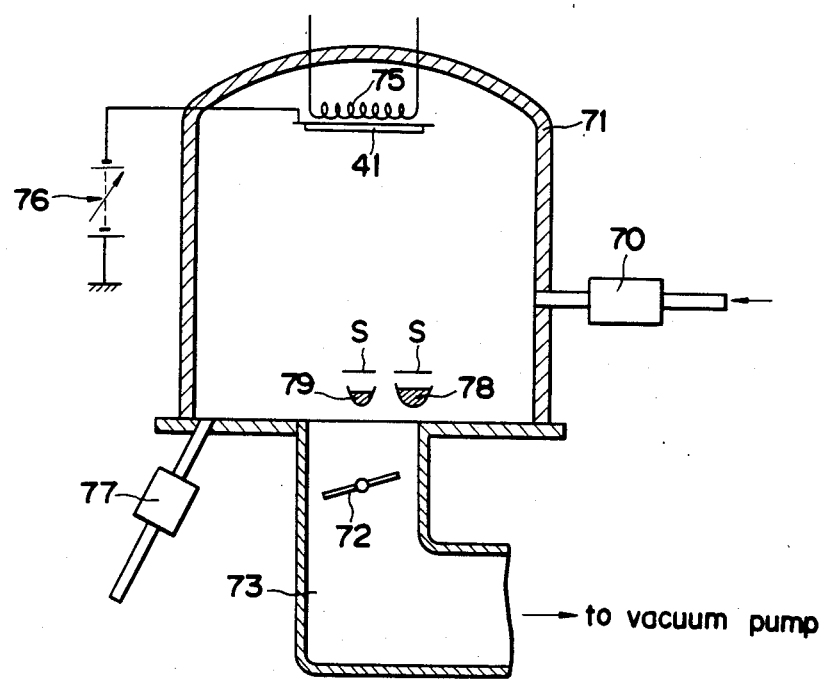
FIG. 13 is a schematic section of the vapor deposition apparatus that can be used to prepare the photoreceptor of the present invention.

An apparatus suitable for use in fabricating the photoreceptor of the present invention by the vapor deposition technique shown in Japanese Patent Application Ser. No. 152455/79 is illustrated in FIG. 13. The apparatus comprises a bell jar 71 which is connected to a vacuum pump (not shown) through an exhaust pipe 73 having a butterfly valve 72. The vacuum pump is capable of evacuating the bell jar 71 to a pressure of $10^{-3}$–$10^{-7}$ Torr. Within the bell jar 71 is provided a substrate 41 which is heated by a heater 75 to a temperature between 100° and 350° C., preferably between 150° and 300° C. A d.c. power supply 76 provides the substrate 41 with a dc voltage which ranges from zero volt to a negative voltage of ten volts, preferably a negative voltage between one and six volts. The bell jar 71 is connected to a hydrogen gas discharge tube 77 which is so positioned that its outlet faces the substrate 41 in the bell jar 71. While activated hydrogen and hydrogen ions are introduced into the bell jar 71 from the discharge tube 77, a silicon evaporation source 78 positioned to face the substrate 41, and if necessary, an aluminum evaporation source 79 also positioned to face the substrate, are heated, with shutters S above the respective evaporation sources being opened, so as to evaporate silicon and aluminum simultaneously in a Si to Al evaporation ratio of $1:10^{-4}$. The $Fe(CO)_5$ gas evolved in a separate apparatus is introduced into a discharge tube 70 where said gas is decomposed to Fe before it is introduced into the bell jar 71. The bell jar 71 is also fed with a suitable amount of $CH_4$ gas through a discharge tube (not shown). By the reaction among the gases introduced into the bell jar, layers 42 and 43 containing specified amount of aluminum and an Fe-containing layer 43a are formed.

Figure 14:
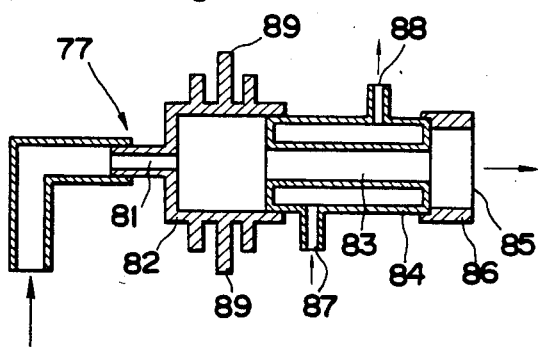
FIG. 14 is a schematic section of the hydrogen gas discharge tube incorporated in the apparatus of FIG. 13.

A typical configuration of the discharge tube 77 is shown in FIG. 14; the tube comprises one cylindrical electrode member 82 having a gas inlet 81, a discharge space member 84, typically made of cylindrical glass, having said electrode member 82 at one end and which encloses a discharge space 83, and the other ring-shaped electrode member 86 having a gas outlet 85 and which is disposed at the other end of said discharge space member 84. A dc or ac voltage is applied between the two electrode members 82 and 86, whereupon a gas, for example, hydrogen gas, fed into the tube 77 through the inlet 81 undergoes glow discharge in the discharge space 83, and the activated hydrogen consisting of hydrogen atoms or molecules that have their energy of electrons increased by the glow discharge, as well as the ionized hydrogen are issued into the bell jar 71 through the outlet 85. The discharge space member 84 shown in FIG. 14 is of a sheathed structure and permits circulation of cooling water, which comes in at 87 and goes out of the space 84 at 88. The electrode 82 is provided with cooling fins 89. The two electrodes used in the hydrogen gas discharge tube 77 are spaced apart by a distance of 10-15 cm, and a voltage of 600 volts is to be applied between these electrodes to perform glow discharge of hydrogen gas at a pressure of about $10^{-2}$ Torr in the space 83.

Another technique that can be used to form the metal containing layer 43a is ion implantation. After an a-Si:H photoconductive layer 43 is formed on layer 42 as shown in FIG. 7, the assembly is put into ion implantation equipment, wherein ions of a predetermined metal (e.g. Co or Fe) are implanted in the surface of the photoconductive layer 43 so as to form a metal containing layer 43a. The depth of this layer and the concentration of the metal in it may be properly adjusted by controlling the energy of implanting ions of the metal. By employing an increased implantation energy, the desired metal containing layer can be selectively formed deeper from the surface of the photoconductive layer 43. Typical implantation energy is 30 keV, with the dose of the dopant etal) being 100 ppm with respect to the Si atom. Another advantage of the ion implantation technique is that doping of the metal can be realized at room temperature without heating the substrate), and that therefore, the desired metal containing layer can be formed without causing any adverse thermal effects on the a-Si layers.

The advantages of the present invention are hereunder described by reference to specific working examples which are given here for illustrative purposes only and are by no means intended to limit the scope of the present invention.

EXAMPLE 1

An electrophotographic photoreceptor having the layer arrangement shown in FIG. 7 was fabricated by glow-discharge decomposition using a drum-shaped aluminum substrate. The process proceeded as follows. The drum-shaped Al substrate 41 having a clean and smooth surface was positioned in a vacuum chamber 52 (FIG. 11) which was evacuated to a pressure of $10^{-6}$ Torr while the substrate was held at a predetermined temperature, typically in the range of 100°-350° C. (preferably 150°-300° C.). High-purity argon was introduced into the vacuum chamber as a carrier gas, and preliminary discharge was performed for 10 minutes at a back pressure of 0.5 Torr while high-frequency (13.56 MHz) voltage was applied. Then, a reactive gas mixture of $SiH_4$ and $B_2H_6$ was introduced and the mixture of $Ar/SiH_4/B_2H_6$ flowing in a ratio of 1:1: ($1.5 \times 10^{-3}$) was decomposed by glow discharge, thereby depositing a charge blocking, p-type a-Si:H layer 42 in a film thickness of 1 μm at a speed of 6 μm/hr. Subsequently, a gas mixture of $B_2H_6$ and $SiH_4$ flowing in a ratio of $1:(1 \times 10^{-5})$ was decomposed by discharge to form an a-Si:H layer 43 (lightly doped with B) in a thickness of 15 μm. Then, liquid iron pentacarbonyl $Fe(CO)_5$ having a vapor pressure of 34 Torr at 25° C. that had been bubbled with argon gas was introduced into the reactor using argon as a carrier gas. This Fe-containing gas was decomposed by glow discharge together with a gas mixture of $Ar/SiH_4/B_2H_6$ flowing in a ratio of $1:1:(1 \times 10^{-5}$, thereby forming an Fe-containing layer 43a of a thickness of 1,000 Å.

The photoreceptor so prepared was subjected to a copying test on a modified version of U-Bix 3000 (product of Konishiroku Photo Industry Co., Ltd.); fogless and sharp images having high resolution, good tone gradation and high image density were produced. Images of good quality could be consistently obtained throughout $2 \times 10^5$ cycles of operation.

COMPARATIVE EXAMPLE 1

In order to show the advantage of the Fe-containing layer (i.e., the formation of a high-quality image due to stabilized potential characteristics and the chemical stability of the photoreceptor's surface), a control photo receptor was fabricated as in Example 1 except that no Fe-containing layer was formed. Images provided from the control photoreceptor were indistinct and contained many white specks, leading to very low resolution.

EXAMPLE 2

As in Example 1, a drum-shaped Al substrate was successively coated with a p-type a-Si:H charge blocking layer (1 μm thick), an a-Si:H layer (15 μm thick) lightly doped with B, and an a-Si:H layer (1000 Å thick) containing a metallic or nonmetallic additive. By esca (electron spectroscopy for chemical analysis), the content of the metallic or nonmetallic additive was controlled at 50-100 ppm based on Si; the metallic additive was selected from among Fe, Co, Ni, Zn and Al, whereas the nonmetallic additive was selected from among F and Cl. The respective additives were incorporated in the top a-Si:H layer by decomposing, through glow discharge, the following compounds (1) to (7) together with the $Ar/SiH_4/B_2H_6$ mixture. The compounds (1) to (7) were introduced into the reaction vessel as being carried by argon.

(1) Iron pentacarbonyl: $Fe(CO)_5$, liquid;
(2) Cobalt dicarbonylcyclopentadienyl: $C_5H_5Co(CO)_2$, liquid;
(3) Nickel nitrosylcyclopentadienyl: $C_5H_5NiNO$, liquid;
(4) Zinc dimethyl: $Zn(CH_3)_2$, liquid;
(5) Aluminum trimethyl: $Al(CH_3)$, liquid;
(6) Fluorine: $F_2$, gas;
(7) Chlorine: $cl_2$, gas.

The seven photoreceptor samples thus prepared were subjected to a copying test on a modified version of U-Bix 3000 (product of Konishiroku Photo Industry Co., Ltd.); after $10^5$ continuous cycles of operation, the quality of the image on copies and the light decaying characteristics half exposure: E½) were checked for all samples, with the results being shown in Table 1. From this table, one can see that the metals incorporated in specified amounts according to the present invention were effective in improving both image quality and sensitivity of photoreceptors.

TABLE 1

| Additive | Fe | Co | Ni | Zn | Al | F | Cl |
|---|---|---|---|---|---|---|---|
| Image quality | ⊙ | △ | ○ | △ | ○ | x | x |
| $E_{\frac{1}{2}}$ (lux · sec) | 0.4 | 0.6 | 0.5 | 0.6 | 0.5 | 1.0 | 1.1 |

Image quality rating indices
⊙: High resolution, good tone gradation, high density, sharp.
○: Indistinct image with white specks occurred only occasionally.
△: Indistinct image with white specks occurred rather frequently.
x: More than half of the image area was indistinct with white specks.

EXAMPLE 3

In Example 2, Fe(CO)$_5$ was found to be the best iron source of the seven compounds used. In Example 3, ferrocene [Fe(C$_5$H$_5$)$_2$] and iron hexafluoroacetylacetone [Fe(HFA)$_3$] were specifically used as iron sources. These two iron sources were solid at room temperature. Each of them was ground into fine particles of the micron order in an argon atmosphere, and the fine particles of each compound were introduced into the reaction vessel as being carried on argon, and in that reaction vessel, the particles were subjected to glow-discharge decomposition together with a mixture of Ar/SiH$_4$/B$_2$H$_6$, thereby forming an Fe-containing a-Si:H layer. The two photoreceptor samples having the same layer arrangement as employed in Example 1 were subjected to a copying test; as in the case of the sample using Fe(CO)$_5$ as an iron source, all of the images obtained were distinct and free from white specks. Images of good quality could be consistently obtained throughout 2×10$^5$ cyclic operations.

EXAMPLE 4

An electrophotographic photoreceptor having the layer arrangement shown in FIG. 8 was fabricated by glow discharge decomposition using a drum-shaped aluminum substrate. The process proceeded as follows. The drum-shaped Al substrate 41 having a clean and smooth surface was positioned in a vacuum chamber 52 (FIG. 11) which was evacuated to a pressure of 10$^{-6}$ Torr while the substrate was held at a predetermined temperature, typically between 100° and 350° C. (preferably 150°–300° C.). High-purity argon was introduced into the vacuum chamber as a carrier gas, and preliminary discharge was performed for 10 minutes at a back pressure of 0.5 Torr while high-frequency (13.56 MHz) voltage was applied.

Then, a reactive gas mixture of SiH$_4$ and CH$_4$ was introduced and the mixture of Ar/SiH$_4$/CH$_4$ flowing in a ratio of 1:1:1 was decomposed by glow discharge, thereby depositing a charge transporting a-SiC:H layer in a film thickness of 15 μm at a speed of 9 μm/hr. Subsequently, the supply of CH$_4$ was discontinued and only SiH$_4$ was kept supplied so as to form a nondoped charge generation a-Si:H layer in a thickness of 1 μm. Then, liquid iron pentacarbonyl Fe(CO)$_5$ having a vapor pressure of 34 Torr (at 25° C.) that had been bubbled with argon was introduced into the reactor using argon as a carrier gas. This Fe-containing gas was decomposed by glow discharge together with SiH$_4$, thereby forming an Fe-containing layer of a thickness of 1,000 Å.

The photoreceptor thus prepared was subjected to a copying test on a modified version of U-Bix 3000 (product of Konishiroku Photo Industry Co., Ltd.); fogless and sharp images having high resolution, good tone gradation and high image density were produced. Images of good quality could be consistently obtained throughout 2×10$^5$ cyclic operations.

COMPARATIVE EXAMPLE 2

In order to show the advantage of the Fe-containing layer (i.e., the formation of a high-quality image due to stabilized potential characteristics and the chemical stability of the photoreceptor's surface) in the function-separated arrangement used in Example 4, a control photoreceptor was fabricated as in Example 4 except that no Fe-containing layer was formed. Images provided from the control photoreceptor were indistinct and contained many white specks, leading to very low resolution.

EXAMPLE 5

An electrophotographic photoreceptor having the layer arrangement shown in FIG. 9 was fabricated by glow-discharge decomposition using a drum-shaped aluminum substrate. The process proceeded as follows. The drum-shaped Al substrate 41 having a clean and smooth surface was positioned in a vacuum chamber 52 (FIG. 11) which was evacuated to a pressure of 10$^{-6}$ Torr while the substrate was held at a predetermined temperature, typically in the range of 100°–350° C. (preferably 150°–300° C.). High-purity argon was introduced into the vacuum chamber as a carrier gas, and preliminary discharge was performed for 10 minutes at a back pressure of 0.5 Torr while high-frequency (13.56 MHz) voltage was applied. Then, a reactive gas mixture of SiH$_4$ and B$_2$H$_6$ was introduced and the mixture of Ar/SiH$_4$/B$_2$H$_6$ flowing in a ratio of 1:1:(1.5×10$^{-3}$) glow discharge, thereby depositing a charge blocking, p-type a-Si:H layer 42 in a film thickness of 1 μm at a speed of 6 μm/hr.

Subsequently, a gas mixture of B$_2$H$_6$ and SiH$_4$ flowing in a ratio of 1:(1×10$^{-5}$) was decomposed by discharge to form an a-Si:H layer 43 (lightly B doped) in a thickness of 15 μm. Then, liquid iron pentacarbonyl Fe(CO)$_5$ having a vapor pressure of 34 Torr (at 25° C.) that had been bubbled with argon gas was introduced into the reactor using argon as a carrier gas. This Fe-containing gas was decomposed by glow discharge together with a mixture of Ar/SiH$_4$/N$_2$ flowing in a ratio of 1:1:5 (B$_2$H$_6$ was no longer supplied), thereby forming an Fe-containing, surface protective a-SiN:H layer 45 of a thickness of 1,000 Å.

The photoreceptor so prepared was subjected to a copying test on a modified version of U-Bix 3000 (product of Konishiroku Photo Industry Co., Ltd.); fogless and sharp images having high resolution, good tone gradation and high image density were produced. Images of good quality could be consistently obtained throughout 2×10$^5$ cyclic operations.

COMPARATIVE EXAMPLE 3

In order to show the advantage of incorporating Fe in the surface protective a-Sin:H layer in the arrangement employed in Example 5, a control photoreceptor was fabricated as in Example 5 except that Fe was absent from the surface protective layer. In the early stage of cyclic copying operations, sharp images having high resolution and good tone gradation were obtained; however, when the number of copying cycles exceeded $3 \times 10^4$, the quality of the image obtained was no longer satisfactory.

EXAMPLE 6

An electrophotographic photoreceptor having the layer arrangement shown in FIG. 10 was fabricated by glow-discharge decomposition using a drum-shaped aluminum substrate. The process proceeded as follows. The drum-shaped Al substrate 41 having a clean and smooth surface was positioned in a vacuum chamber 52 which was evacuated to a pressure of $10^{-6}$ Torr while the substrate was held at a predetermined temperature, typically in the range of 100°-350° C. (preferably 150°-300° C.). High-purity argon was introduced into the vacuum chamber as a carrier gas, and preliminary discharge was performed for 10 minutes at a back pressure of 0.5 Torr while high-frequency (13.56 MHz) voltage was applied.

Then, a reactive gas mixture of $SiH_4$ and $CH_4$ was introduced and the mixture of $Ar/SiH_4/CH_4$ flowing in a ratio of 1:1:1 was decomposed by glow discharge, thereby depositing a charge transporting a-SiC:H layer 44 in a film thickness of 15 μm at a speed of 9 μm/hr.

Subsequently, the supply of $CH_4$ was discontinued and only $SiH_4$ was kept decomposed by glow discharge, thereby forming a non-doped charge generation a-Si:H layer 43 in a thickness of 1 μm. Then, liquid iron pentacarbonyl Fe$(CO)_5$ having a vapor pressure of 34 Torr (at 25° C.) that had been bubbled with argon was introduced into the reactor using argon as a carrier gas. While $CH_4$ was supplied again, the Fe-containing gas was decomposed by glow discharge together with a gas mixture of $Ar/SiH_4/CH_4$ flowing in a ratio of 1:1:4, thereby forming an Fe-containing surface protective a-SiC:H layer 46 of a thickness of 1,000 Å.

The photoreceptor thus prepared was subjected to a copying test on a modified version of U-Bix 3000 (product of Konishiroku Photo Industry Co., Ltd.); fogless and sharp images having high resolution, good tone gradation and high image density were produced. Images of good quality could be consistently obtained throughout $3 \times 10^5$ cyclic operations.

COMPARATIVE EXAMPLE 4

In order to show the advantage of incorporating Fe in the surface protective a-SiC:H layer in the arrangement employed in Example 6, a control photoreceptor was fabricated as in Example 6 except that Fe was absent from the surface protective layer. In the early stage of cyclic copying operations, sharp images having high resolution and good tone gradation were obtained; however, when the number of copying cycles exceeded $10^5$, the quality of the image obtained was no longer satisfactory.

EXAMPLE 7

As in Example 6, a drum-shaped Al substrate was successively coated with a charge transporting a-SiC:H layer (15 μm thick), an undoped, charge generation a-Si:H layer (1 μm thick), and a surface protective a-SiC:H layer (1000 Å thick) containing a metallic or nonmetallic additive. By esca, the content of the metallic or nonmetallic additive was controlled at 50–100 ppm based on Si; the metallic additive was selected from among Fe, Co, Ni, Zn and Al, whereas the nonmetallic additive was selected from among F and Cl. The respective additives were incorporated in the surface protective a-Si:H layer by decomposing, through glow discharge, the following compounds (1) to (7) together with a gas mixture of $Ar/SiH_4/CH_4$ flowing in a ratio of 1:1:4. The compounds (1) to (7) were introduced into the reaction vessel as being carried by argon.

(1) Iron pentacarbonyl: Fe$(CO)_5$, liquid;
(2) Cobalt dicarbonylcyclopentadienyl: $C_5H_5Co(CO)_2$, liquid;
(3) Nickel nitrosylcyclopentadienyl: $C_5H_5NiNO$, liquid;
(4) Zinc dimethyl: $Zn(CH_3)_2$, liquid;
(5) Aluminum trimethyl: $Al(CH_3)$, liquid;
(6) Fluorine: $F_2$, gas; and
(7) Chlorine: $Cl_2$, gas.

The seven photoreceptor samples thus prepared were subjected to a copying test on a modified version of U-Bix 3000 (product of Konishiroku Photo Industry Co., Ltd.); after $2 \times 10^5$ continuous cycles of operation, the quality of the image on copies and the light decaying characteristics (half exposure: $E_{\frac{1}{2}}$) were checked for all samples, with the results being shown in Table 2.

TABLE 2

| Additive | Fe | Co | Ni | Zn | Al | F | Cl |
|---|---|---|---|---|---|---|---|
| Image quality | ◉ | Δ | ○ | Δ | ○ | x | x |
| $E_{\frac{1}{2}}$ (lux · sec) | 0.8 | 1.0 | 0.9 | 1.0 | 0.9 | 2.4 | 2.5 |

Image quality rating indices
◉: High resolution, good tone gradation, high density, sharp.
○: Indistinct image with white specks occurred only occasionally.
Δ: Indistinct image with white specks occurred rather frequently.
x: More than half of the image was indistinct with white specks.

As one can see from the above data, the metals incorporated in specified amounts in the surface protective layer according to the present invention were effective in improving both image quality and sensitivity of photoreceptors.

EXAMPLE 8

In Example 7, Fe$(CO)_5$ was found to be the best iron source of the seven compounds used. In Example 8, ferrocene [Fe$(C_5H_5)_2$] and iron hexafluoroacetylacetone [Fe(HFA)$_3$] were specifically used as iron sources. These two iron sources were solid at room temperature. Each of them was ground into fine particles of the micron order in an argon atmosphere, and the fine particles of each compound were introduced into the reaction vessel as being carried on argon, and in that reaction vessel, the particles were subjected to glow-discharge decomposition together with a mixture of $Ar/SiH_4/CH_4$, thereby forming an Fe-containing a-SiC:H layer. The two photoreceptor samples having the same layer arrangement as employed in Example 2 were subjected to a copying test; as in the case of the sample using Fe$(CO)_5$ as an iron source, all of the images obtained were distinct and free from white specks. Images of good quality could be consistently obtained throughout $2 \times 10^5$ cyclic operations.

What is claimed is:

1. In an electrophotographic photoreceptor which comprises an electrically conductive support an at least one amorphous silicon photoconductive layer provided on said support, the improvement characterized in that the outermost surface of said photoreceptor consists of an amorphous silicon, and atoms/or ions of a metal selected from the group consisting of atoms of 3b, 4b, 5b, 6b, 7b, 8, 1b and 2b of the Periodic Table are present at or in close proximity to said outermost surface.

2. The photoreceptor of claim 1 wherein said outermost surface is a part of said amorphous silicon photoconductive layer.

3. The photoreceptor of claim 1 wherein said outermost surface is a part of an amorphous silicon layer other than said photoconductive amorphous silicon layer.

4. The photoreceptor of claim 1 wherein the atoms and/or ions of said metal are present at a depth from the outermost surface of 0 to 20,000 Å with thickness of 50 to 20,000 Å.

5. The photoreceptor of claim 4 wherein the thickness is 50 to 5,000 Å.

6. The photoreceptor of claim 4 wherein the thickness is 400 to 2,000 Å.

7. The photoreceptor of claim 4 wherein said metal is one which composes a Freidel-Crafts catalyst.

8. The photoreceptor of claim 4 wherein the atoms and/or ions of said metal are present in an amount of $1$–$10^4$ ppm with respect to the silicon atom.

9. The photoreceptor of claim 3 wherein said amorphous silicon layer other than said photoconductive amorphous silicon layer is a protective layer made of amorphous hydrogenated and/or fluorinated silicon carbide, amorphous hydrogenated and/or fluorinated silicon nitride or amorphous hydrogenated and/or fluorinated silicon oxide.

* * * * *